United States Patent [19]

Arakawa

[11] Patent Number: 4,703,456
[45] Date of Patent: Oct. 27, 1987

[54] NON-VOLATILE RANDOM ACCESS MEMORY CELL

[75] Inventor: Hideki Arakawa, Yokohama, Japan

[73] Assignee: Fujitsu Limited, Kanagawa, Japan

[21] Appl. No.: 858,465

[22] Filed: Apr. 23, 1986

[30] Foreign Application Priority Data

Apr. 24, 1985 [JP] Japan ................................. 60-87718

[51] Int. Cl.⁴ ........................................... G11C 11/70
[52] U.S. Cl. ..................................... 365/185; 365/154
[58] Field of Search ........................ 365/154, 185, 190

[56] References Cited

U.S. PATENT DOCUMENTS

| | | | |
|---|---|---|---|
| 4,300,212 | 11/1981 | Simko | 365/185 |
| 4,408,303 | 10/1983 | Guterman et al. | 365/185 |
| 4,527,258 | 7/1985 | Guterman | 365/185 |
| 4,630,238 | 12/1986 | Arakawa | 365/185 |

Primary Examiner—James W. Moffitt
Attorney, Agent, or Firm—Armstrong, Nikaido, Marmelstein & Kubovcik

[57] ABSTRACT

A non-volatile random access memory (NVRAM) cell including a volatile static type random access memory cell consisting of a flop-flip circuit having two nodes on which a paired bit signal are accessed and a non-volatile electrically erasable programmable read-only memory (EEPROM) cell consisting of a memory transistor having a floating gate, a capacitor circuit, on which a voltage called as a writing voltage is applied, including a tunnel capacitor, and two transistors for determining the polarity of the charge being to be stored at the floating gate with a tunnel current in the tunnel capacitor corresponding to the level of the bit signal existing at one of the two nodes in the flip-flop circuit. When the power supply voltage of the NVRAM cell is turned off, the EEPROM cell stores the positive or negative charge at the floating gate corresponding to the bit signal level at the node in the flip-flop circuit holding the charge after the power supply voltage and the writing voltage are turned off. When the power supply voltage is turned on, the EEPROM cell recalls the state of the flip-flop circuit so as to be same as before using the charge stored at the floating gate.

6 Claims, 5 Drawing Figures

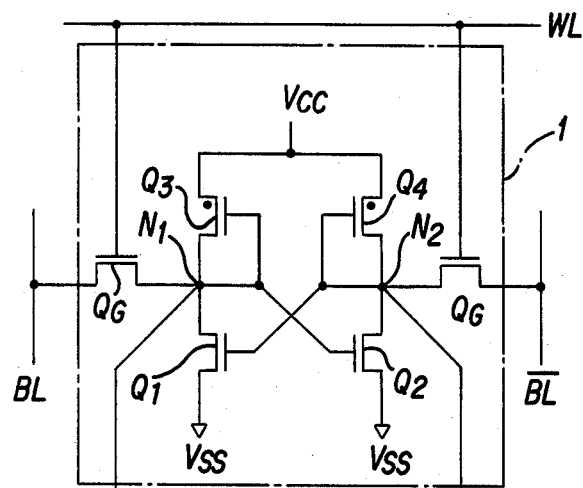
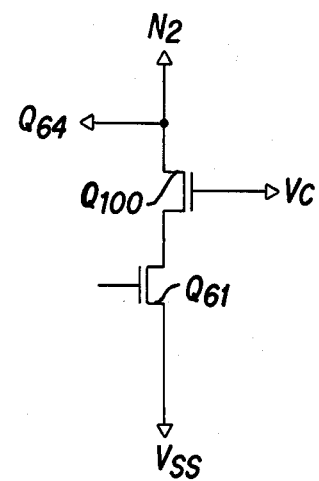
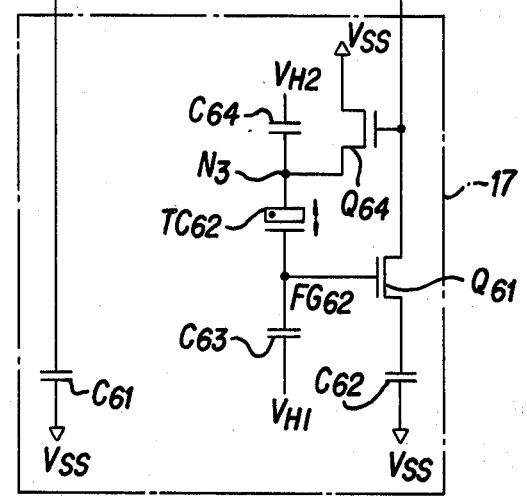
FIG. 2(a)
PRIOR ART
FIG. 2(b)
PRIOR ART

NON-VOLATILE RANDOM ACCESS MEMORY CELL

BACKGROUND OF THE INVENTION

The present invention relates to a non-volatile random-access memory (NVRAM) cell, more particularly to an NVRAM cell constituted by a volatile static type random-access memory (SRAM) cell portion and a non-volatile electrically erasable programmable read-only memory (EEPROM) cell portion.

Generally, in the art of a semiconductor memory device, an ideal semiconductor memory device has been awaited to be realized, wherein, the ideal semiconductor memory device is such that therein the data can be re-written without limitation, the access thereto can be made in a short time, and the type thereof is a non-volatile one.

Generally, an SRAM cell has a merit that the access time is short and the data can be re-written without limitation but a demerit that its type is a volatile one; on the contrary, an EEPROM cell has a merit that its type is a non-volatile one but a demerit that a long access time is required and the number of times for re-writing the data is limited.

To realize the ideal semiconductor memory device, recently, an NVRAM cell is developed by combining the merits of the SRAM cell and the EEPROM cell. When the power supply voltage of the NVRAM cell is ON, using the merit of the SRAM cell, the data can be written into or read out from the NVRAM cell in a short time and also the data can be re-written without any limitation. When the power supply voltage of the NVRAM cell is turned off, using the merit of the EEPROM cell, the data in the SRAM cell portion can be stored in the EEPROM cell portion and the data stored in the EEPROM cell portion can be recalled to the SRAM cell portion when the power supply voltage is turned on. The demerit of the long access time of the EEPROM cell gives no influence to the NVRAM cell because the data access is required only in a short time during the power supply voltage of the NVRAM cell is turned on and off.

However, the NVRAM cell has a problem that the size of it becomes large; accordingly, many trials have been made to reduce the cell size for increasing the packing density of the memory device consisting of the NVRAM cells. In the NVRAM cell, the SRAM cell portion therein consists of few components of a flip-flop circuit, so that the EEPROM cell portion therein becomes a subject for increasing the packing density of the NVRAM cell. The U.S. patent application Ser. No. 659,191 filed Oct. 9, 1984 and now U.S. Pat. No. 4,630,238 invented by the same inventor of the present invention gave a solution to the above problem by increasing the packing density of the EEPROM cell portion. According to the U.S. patent application Ser. No. 659,191 now U.S. Pat. No. 4,630,238, a prior art NVRAM cell was such as shown in FIG. 1 and an NVRAM cell embodying the patent application is such as shown in FIG. 2(a).

In FIGS. 1 or 2(a), the NVRAM cell functions as a memory matrix element of a memory device, wherein the element is designated by respective word line WL and respective pair of bit lines BL and $\overline{BL}$ of the memory device. The NVRAM cell of FIG. 1 consists of an SRAM cell portion 1 and an EEPROM cell portion 2 and the NVRAM cell of FIG. 2(a) consists of an SRAM cell portion 1 and an EEPROM cell portion 17; the SRAM cell portions 1 of FIGS. 1 and 2(a) are equal to each other. Compared between FIGS. 1 and 2(a), it can be seen that the improvement of the packing density of the NVRAM cell is performed by reducing the circuit components of the EEPROM cell portion 2. FIG. 2(b) shows a modified partial circuit of FIG. 2(a); i.e., in FIG. 2(b), instead of removing the capacitor $C_{62}$ in FIG. 2(a), a control transistor $Q_{100}$ is placed between the node $N_2$ and the transistor $Q_{61}$. The details of the function of the NVRAM cell in FIGS. 1 and 2(a) and of 2(b) are well discussed in the U.S. patent application Ser. No. 659,191 now U.S. Pat. No. 4,630,238, so that the explanation of these details are not repeated here.

In the U.S. patent application Ser. No. 659,191 now U.S. Pat. No. 4,630,238, many embodiments were disclosed, and above all it becomes practically cleared that the NVRAM cell shown in FIG. 2(a) is most useful, because, as seen from FIG. 2(a), the NVRAM cell of FIG. 2(a) has the structure of removing the connection between the node $N_1$ of the SRAM cell portion 1 and the circuit of the EEPROM cell portion 2, so that the NVRAM cell of FIG. 2(a) is effective not only for increasing the packing density of the NVRAM cell but also for obtaining the freedom for designing the structure of the NVRAM cell. However, as shown in FIG. 2(a), the EEPROM cell portion 17 operates with two kinds of the power sources $V_{H1}$ and $V_{H2}$. The two kinds of power sources make the peripheral circuit of the NVRAM cell a little more complicate, which, however, is not so negative factor for the NVRAM cell of FIG. 2(a). The two kinds of power supply voltage bring new problems to the NVRAM cell of FIG. 2(a) as follows.

(1) Two steps such as "pre-set" and "set" are necessary every time the floating gate $FG_{62}$ of the transistor $Q_{61}$ in the EEPROM cell portion 17 is charged or discharged for storing the data, so that it takes too much time to store the data.

(2) When the memory device consisting of a plurality of the NVRAM cells is used as a read only memory (ROM) device, the two steps of "pre-set" and "set" must be functioned every time the data is stored and recalled; accordingly, the life of the memory device is reduced. And, (3) in a semiconductor device, a PN junction generally produces the leakage current, e.g., the leakage current flows at a node $N_3$ in FIG. 2(a), so that the holding time, which should be long for the NVRAM cell, of the capacitance-coupling-charge becomes short when the temperature at the PN junction increases. Therefore, repeating the charging on the floating gate again and again is necessary for lengthening the apparent holding time under the consideration of the upper allowable limit of the temperature characteristic of the NVRAM cell. However, the repeat of the charging cannot be made in the NVRAM cell of FIG. 2(a), because the floating gate $FG_{62}$ is always discharged every time the new data is going to be stored in the EEPROM cell portion 17.

SUMMARY OF THE INVENTION

An object of the present invention is to increase the packing density of the memory device consisting of the NVRAM cells keeping the reliability high.

Another object of the present invention is to give more freedom of designing the semiconductor structure of the NVRAM cell.

A still another object of the present invention is to increase the yield rate of the production of the memory device consisting of the NVRAM cells.

Yet another object of the present invention is to make the time for storing or re-calling the data into or out from the EEPROM cell portion of the NVRAM cell short.

A further object of the present invention is to increase the life of the NVRAM cell.

A still further object of the present invention is to obtain the NVRAM cell on which the repeat of the charging for storing a datum can be made any number of times.

The objects of the present invention are achieved by providing an improved EEPROM cell portion combining with the SRAM cell portion. The improved EEPROM cell portion operates under only one power supply voltage called as a writing voltage when the power supply voltage for the SRAM cell portion is intended to be turned off. The improved EEPROM cell portion comprises a memory transistor having a floating gate to which the charge is stored so that the polarity of the charge is determined in correspondence with the level of the bit signal at one node of the flip-flop circuit in the SRAM cell portion, a capacitor circuit comprising a tunnel capacitor, and two transistors for controlling the polarity of the charge being to be stored at the floating gate in cooperation with a tunnel current of the tunnel capacitor.

BRIEF DESCRIPTION OF THE DRAWINGS

FIG. 2(a) is a circuit diagram of another prior art NVRAM cell;

FIG. 2(b) is a modified partial circuit of FIG. 2(a);

DESCRIPTION OF THE PREFERRED EMBODIMENT

Figure 1:
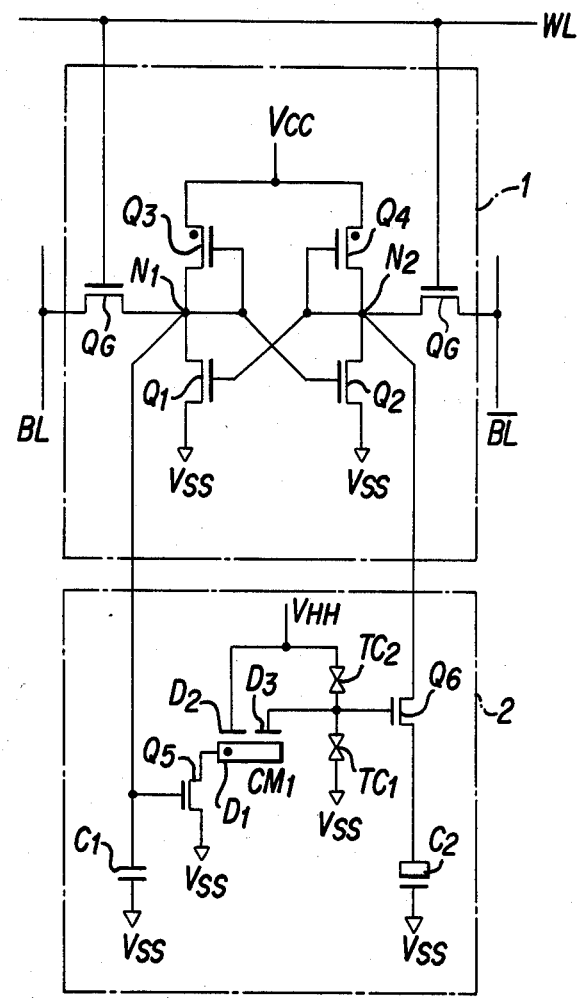
FIG. 1 is a circuit diagram of a prior art NVRAM cell.
Figure 3:
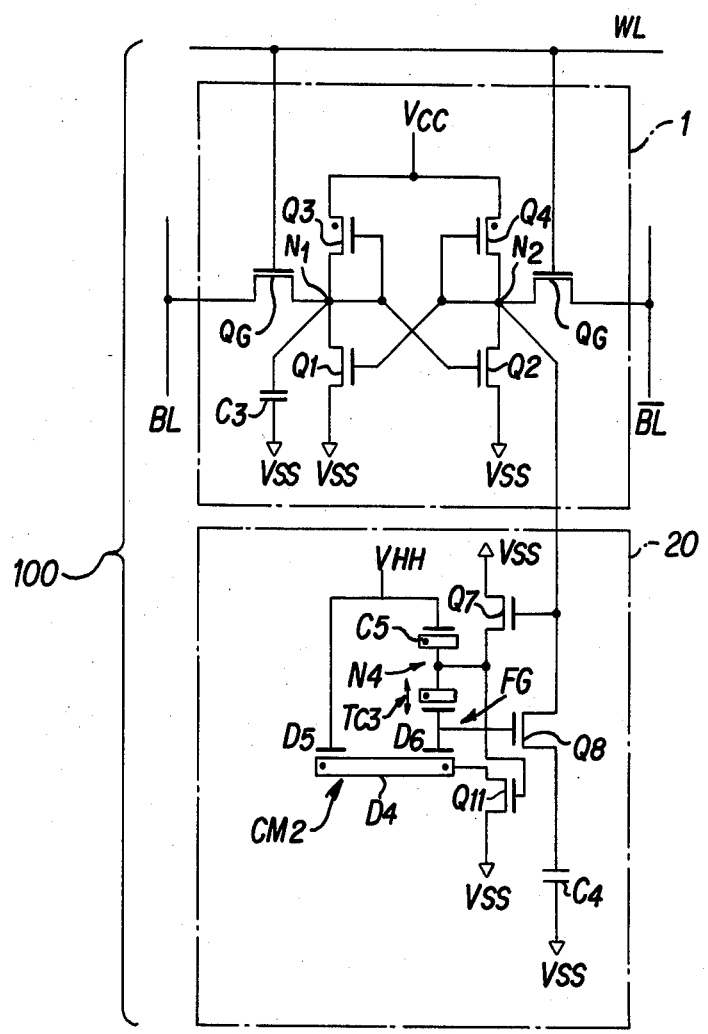
FIG. 3 is a circuit diagram embodying the present invention.

FIG. 3 shows a circuit diagram of the NVRAM cell embodying the present invention. In FIG. 3, the same reference numerals and symbols as in FIGS. 1 and 2(a) designate the same elements or parts as in FIGS. 1 and 2(a). Reference numeral 100 is an NVRAM cell consisting of an SRAM cell portion 100, which is the same SRAM cell portion 1 in FIGS. 1 or 2(a), and an EEPROM cell portion 20. A plurality of the NVRAM cells 1 form a memory device (an NVRAM device) having the structure of a memory matrix, and each NVRAM cell is designated by respective word-line WL and respective pair of bit-lines BL and $\overline{BL}$.

The SRAM cell portion 1 comprises four metal insulator semiconductor (MIS) transistors $Q_1$, $Q_2$, $Q_3$, and $Q_4$ (the transistors $Q_1$ and $Q_2$ are the ordinary enhancement type and the transistors $Q_3$ and $Q_4$ are the depletion type which are distinguished from the enhancement type with putting the black dot on each depletion type transistor) which are cross-coupled at nodes $N_1$ and $N_2$ forming an ordinary flip-flop circuit, and complementary signals such as a paired bit signals are written into the flip-flop circuit from the bit-lines BL and $\overline{BL}$ or read out from the flip-flop circuit to the bit-lines BL and $\overline{BL}$ through two transfer gate MIS transistors $Q_{Gs}$ connected to the nodes $N_1$ and $N_2$.

The EEPROM cell portion 20 is a non-volatile memory cell which comprises a memory MIS transistor $Q_8$ having a floating gate FG, the MIS transistors $Q_7$ and $Q_{11}$, and a capacitor circuit consisting of the capacitor module $CM_2$, the capacitors $C_4$ and $C_5$, and tunnel capacitor $TC_3$. The capacitor module $CM_2$, the tunnel capacitor $TC_3$, and the capacitor $C_5$ are made from the depletion type MIS transistors (each having a black dot) connecting the drain and the the source of respective transistor. Wherein, the capacitor module $CM_2$ has static capacitance between a common electrodes $D_4$ and an electrode $D_5$ and the common electrode $D_4$ and an electrode $D_6$; the tunnel capacitor $TC_3$ is a capacitor functioning by a tunnel effect and whose capacitance is selected so as to be sufficiently small compared with the capacitance of the capacitor module $CM_2$ and the capacitor $C_5$; and the capacitor $C_4$ is selected sufficiently large compared with that of the capacitor $C_3$ of the SRAM cell portion 1. The transistors $Q_7$ and $Q_{11}$ each functions as a switch corresponding to a signal level H or L applied to the gate; however, they operate reversely to each other, i.e., the transistor $Q_{11}$ operates OFF and ON corresponding to ON and OFF operations of the transistor $Q_7$.

The operation of the NVRAM cell embodying the present invention is divided into following modes: (1) Store Mode 1 (The mode of storing the datum in the SRAM cell portion 1 into the EEPROM cell portion 20 when the potential at the node $N_1$ is L and that at the node $N_2$ is H), (2) Store Mode 2 (The same store mode but when the potential at the node $N_1$ is H and that at the node $N_2$ is L), (3) Recall Mode 1 (The mode of recalling the datum stored in the EEPROM cell portion 20 back to the SRAM cell portion 1 when the negative charge is stored at the floating gate FG of the transistor $Q_8$), and (4) Recall Mode 2 (The same recall mode but when the positive charge is stored at floating gate FG). In the modes, the NVRAM cell operates as follows.

(1) Store Mode 1

Raise the writing voltage $V_{HH}$ up to 20–30 volt (V) from 0 V, before turning the power supply voltage $V_{CC}$ off. At this time, since the voltage at the node $N_2$ is "H", the transistor $Q_7$ is ON (reference symbol $V_{SS}$ is the low potential such as the earth potential), so that the potential at the node $N_4$ becomes L and the transistor $Q_{11}$ becomes OFF. Accordingly, the writing voltage $V_{HH}$ is applied to a series circuit consisting of the capacitor formed between the electrodes $D_4$ and $D_5$, the capacitor formed between the electrodes $D_4$ and $D_6$, and the tunnel capacitor $TC_3$. As mentioned before, the static capacitance of the capacitor module $CM_2$ is sufficiently larger than that of the tunnel capacitor $TC_3$, so that most part of the writing voltage $V_{HH}$ is applied to the tunnel capacitor $TC_3$. At this time, the electrons are injected from the node $N_4$ to the floating gate FG of the transistor $Q_8$ through the tunnel capacitor $TC_3$ by the tunnel effect, so that the negative charge is stored at the floating gate FG, which makes the transistor $Q_8$ OFF, and the negative charge stored at the floating gate FG is held on for a long period, even though the power supply voltage $V_{CC}$ and the writing voltage $V_{HH}$ are turned off. Thus, the datum in the SRAM cell portion 1 is equal to be completely stored into the EEPROM cell portion 20. From the above, the transistor $Q_8$ is called as a memory transistor.

(2) Store Mode 2

Since the potential at the node $N_2$ is L, the transistor $Q_7$ becomes OFF, so that the node $N_4$ becomes the floating state; however, when the writing voltage $V_{HH}$ is applied, the potential at the node $N_4$ rise up, which brings the transistor $Q_{11}$ ON. Accordingly, the writing voltage $V_{HH}$ is applied to the series circuit consisting of the capacitor $C_5$, the tunnel capacitor $TC_3$, and the capacitor formed between the electrodes $D_4$ and $D_6$, so that the most part of the writing voltage $V_{HH}$ is applied to the tunnel capacitor $TC_3$ because the capacitance of the tunnel capacitor is sufficiently small compared with other capacitance of the capacitors in the series circuit as mentioned before. In this case, since the potential at the node $N_4$ is higher than that at the floating gate FG, the electron which has existed at the floating gate FG is extracted by the tunnel effect of the tunnel capacitor $TC_3$; accordingly, the positive charge is stored at the floating gate FG making the transistor $Q_8$ ON. The positive charge stored at the floating gate FG is held on for a long period. Thus, the datum in the SRAM cell portion 1 is equal to be completely stored into the EEPROM cell portion 20.

(3) Recall Mode 1

First, set the power supply voltage $V_{CC}$ for the memory cell 1 to 0 V. At this time, since the negative charge exists at the floating gate FG, the transistor $Q_8$ is cut off disconnecting the connection between the node $N_2$ and the capacitor $C_4$. Therefore, when the power supply voltage $V_{CC}$ (5 V) is turned on, since the capacitor $C_3$ is connected to the node $N_1$ and the capacitor $C_4$ is disconnected from the node $N_2$, the potential at the node $N_1$ becomes L because only the load at the node $N_1$ is heavy, and the potential at the node $N_2$ becomes H. Thus, the datum stored in the EEPROM cell portion 20 is recalled to the NVRAM cell when the power supply voltage is turned on.

(4) Recall Mode 2

First, set the power supply voltage $V_{CC}$ for the memory cell 1 to 0 V. At this time, the positive charge exists at the floating gate FG, so that the transistor $Q_8$ is ON connecting the node $N_2$ to the capacitor $C_4$. Therefore, when the power supply $V_{CC}$ (5 V) is turned on, since the capacitance of the capacitor $C_4$ is selected so as to be larger than that of the capacitor $C_3$, the flip-flop circuit in the SRAM cell portion 1 functions so that the potential at the $N_1$ becomes H and that at the $N_2$ becomes L. Thus, the datum stored in the EEPROM cell portion 20 is recalled to the NVRAM cell when the power supply voltage is turned on.

As seen from the above discussion, the EEPROM cell portion 20 uses only one writing voltage $V_{HH}$; therefore, there is no problem the prior art NVRAM cell, shown in FIG. 2, has had; i.e., the problems of the prior art NVRAM cell being such that it takes too much time to store and recall the data, the life of the NVRAM cell becomes short, and the enough holding time is hard to be obtained can be all solved by the present invention.

Figure 4:
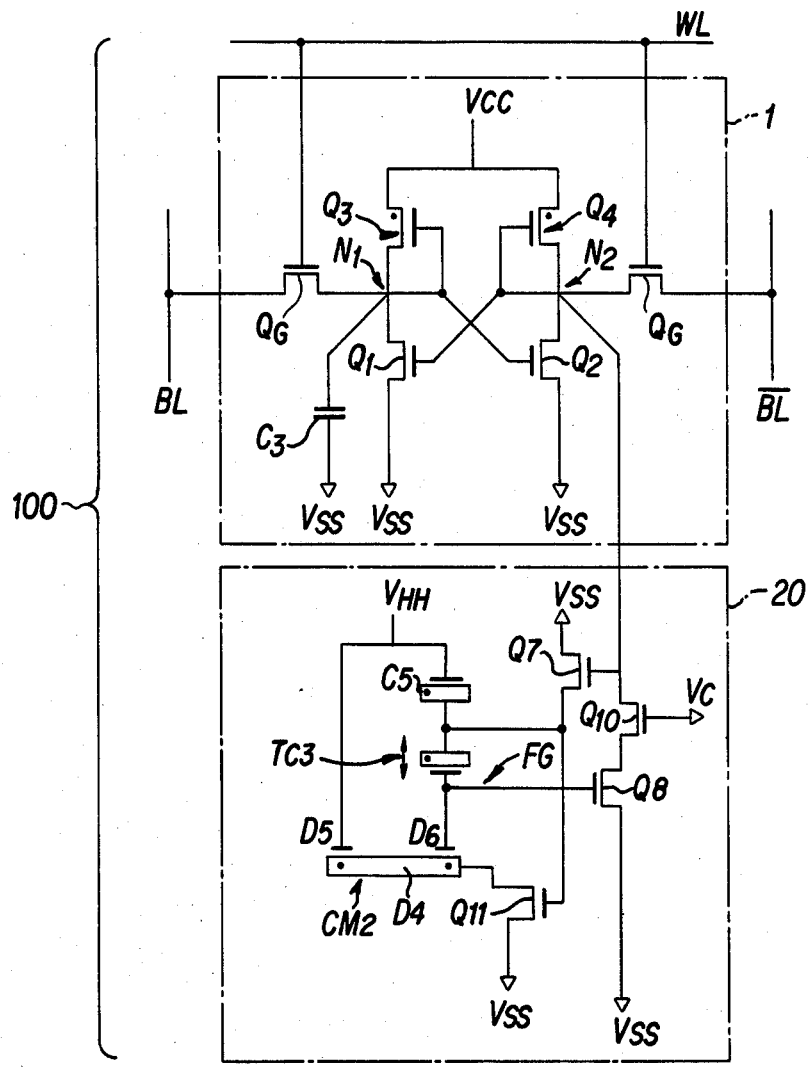
FIG. 4 is another circuit diagram embodying the present invention.

FIG. 4 is a circuit diagram of the NVRAM cell showing another embodiment of the present invention. The function and the operation of FIG. 4 are equal to those of FIG. 3. In FIG. 4, only the circuit from the node $N_2$ to the earth potential $V_{SS}$ through the transistor $Q_8$ and the capacitor $C_4$ in FIG. 3 is modified similarly to the modified partial circuit shown in FIG. 2(b); i.e., the capacitor $C_4$ in FIG. 3 is took off, and a control transistor $Q_{10}$ is placed between the node $N_2$ and the transistor $Q_8$ for switching the connection between the node $N_2$ and the memory transistor $Q_8$; the switching action is made by a control voltage $V_C$ applied to the gate of the transistor $Q_{10}$.

What is claimed is:

1. A non-volatile random access memory cell comprising:
    a volatile memory cell for storing a datum comprising flip-flop circuit having a first and second nodes on which complementary signals corresponding to the stored datum are output, and
    a first capacitor connected to said first node; and
    a non-volatile memory cell comprising
        a second capacitor, operatively connected to said second node, having a capacitance larger than that of said first capacitor,
        a memory transistor having a floating gate, connected between said second node and said second capacitor, said memory transistor acting as a switch in accordance with the polarity of the charge stored at said floating gate,
        a capacitor circuit comprising a tunnel capacitor operatively connected to said floating gate,
        means, operatively connected to said capacitor circuit, for applying a writing voltage having an amplitude large enough to cause a tunnel current to flow through said tunnel capacitor,
        a first transistor, operatively connected to said second node and to said capacitor circuit, for controlling the polarity of said tunnel current in accordance with said stored datum, said first transistor generating an output in response to one of said complementary signals at said second node, and
        a second transistor, operatively connected to said capacitor circuit receiving the output of said first transistor, for controlling the polarity of said tunnel current in accordance with said stored datum,
    said first and second transistors cooperatively controlling the polarity of the tunnel current to flow through said tunnel capacitor when said writing voltage is applied to said capacitor circuit, one of said first and second transistors being ON and the other being OFF when said tunnel current is to be flown, said polarity of the tunnel current being controlled to be in one of two directions opposite to each other depending on which one of said first and second transistors is ON, said two directions being such that said floating gate is provided with one of negative and positive charges by said tunnel current in one of said two directions, respectively.

2. A non-volatile random access memory cell comprising:
    a volatile memory cell for storing a datum comprising flip-flop circuit having a first and second nodes on which complementary signals corresponding to the stored datum are output, and
    a first capacitor connected to said first node; and
    a non-volatile memory cell comprising
        a memory transistor having a floating gate, connected to said second node, said memory transistor acting as a switch in accordance with the polarity of the charge stored at said floating gate,
        a capacitor circuit comprising a tunnel capacitor operatively connected to said floating gate, means, operatively connected to said capacitor circuit, for applying a writing voltage having an amplitude large enough to cause a tunnel current to flow through said tunnel capacitor, a first transistor, operatively connected to said second node and to said capacitor circuit, for controlling the polarity of said tunnel current in accordance with said stored datum, said first transistor generating an output in response to one of said complementary signals at said second node, a second transistor, operatively connected to said capacitor circuit receiving the output of said first transistor, for controlling the polarity of said tunnel current in accordance with said stored datum, and a third transistor, connected between said second node and said memory transistor, for switching the connection between said second node and said memory transistor, said first and second transistors cooperatively controlling the polarity of the tunnel current to flow through said tunnel capacitor when said writing voltage is applied to said capacitor circuit, one of said first and second transistors being ON and the other being OFF when said tunnel current is to be flown, said polarity of the tunnel current being controlled to be in one of two directions opposite to each other depending on which one of said first and second transistors is ON, said two directions being such that said floating gate is provided with one of negative and positive charges by said tunnel current in one of said two directions, respectively.

3. A non-volatile random access memory cell according to claim 1 or 2, wherein said capacitor circuit of said non-volatile memory cell further comprising a third capacitor, one side electrode thereof being connected to said writing voltage and the other side electrode thereof being connected to one side electrode of said tunnel capacitor, the source of said first transistor, and the gate of said second transistor, and a capacitor module having a common electrode, a first electrode forming a fourth capacitor with said common electrode, and a second electrode forming a fifth capacitor with said common electrode, said first electrode being connected to said writing voltage, said common electrode being connected to the source of said second transistor, and said second electrode being connected to said floating gate and the other side electrode of said tunnel capacitor.

4. A non-volatile random access memory cell according to claim 1 or 2, wherein said first transistor operates under a power supply voltage applied to said non-volatile random access memory cell against earth potential and said fist transistor has the gate connected to said second node and the drain connected to said earth potential.

5. A non-volatile random access memory cell according to claim 1 or 2, wherein said second transistor operates under a power supply voltage applied to said non-volatile random access memory cell against earth potential and said second transistor has the drain connected to said earth potential.

6. A non-volatile random access memory cell according to claim 1 or 2, wherein said volatile memory cell is a volatile static type random access memory cell and said non-volatile memory cell is a non-volatile electrically erasable programmable read-only memory cell.

* * * * *